US009671448B2

(12) United States Patent
Nelsen et al.

(10) Patent No.: US 9,671,448 B2
(45) Date of Patent: Jun. 6, 2017

(54) IN-TOOL ESD EVENTS MONITORING METHOD AND APPARATUS

(71) Applicant: Illinois Tool Works Inc., Glenview, IL (US)

(72) Inventors: Lyle D. Nelsen, San Jose, CA (US); Steven B. Heymann, Los Gatos, CA (US); Mark E. Hogsett, Tiburon, CA (US)

(73) Assignee: Illinois Tool Works Inc., Glenview, IL (US)

( * ) Notice: Subject to any disclaimer, the term of this patent is extended or adjusted under 35 U.S.C. 154(b) by 29 days.

(21) Appl. No.: 14/140,860

(22) Filed: Dec. 26, 2013

(65) Prior Publication Data

US 2014/0184253 A1   Jul. 3, 2014

Related U.S. Application Data

(60) Provisional application No. 61/747,199, filed on Dec. 28, 2012.

(51) Int. Cl.
   *G01R 31/00* (2006.01)
   *G01R 35/00* (2006.01)

(52) U.S. Cl.
   CPC ......... *G01R 31/002* (2013.01); *G01R 31/001* (2013.01); *G01R 35/005* (2013.01)

(58) Field of Classification Search
   CPC .... G01R 31/002; G01R 31/02; G01R 35/005; G01R 23/15; G01R 29/0814; G01R 29/0821; G01R 29/0864; G01R 29/0871; G01R 29/0878; G01R 29/24; G01R 31/001; G01R 31/003; G01R 31/025; G01R 31/1263; G01R 31/302; G01T 1/161; G01T 1/164

USPC ....... 324/207.16, 509, 457, 458, 227, 76.13, 324/76.16, 95, 102, 750.02, 382, 72.5, 72, 324/452, 456, 45; 361/112, 113, 91; 340/600, 635, 657, 649

See application file for complete search history.

(56) References Cited

U.S. PATENT DOCUMENTS

| | | | |
|---|---|---|---|
| 2,909,190 A | | 10/1959 | Wilson |
| 5,315,255 A | | 5/1994 | Bettinger |
| 5,430,381 A | | 7/1995 | Dower |
| 5,463,379 A | | 10/1995 | Campbell et al. |
| 5,903,220 A | * | 5/1999 | Jon ..................... G01R 31/002 324/457 |

(Continued)

OTHER PUBLICATIONS

T.J. Maloney, "Easy Access to Pulsed Hertzian Dipole Fields Through Pole-Zero Treatment", cover article, IEEE EMC Society Newsletter, Summer 2011, pp. 34-42.

(Continued)

*Primary Examiner* — Arleen M Vazquez
*Assistant Examiner* — Steven Yeninas
(74) *Attorney, Agent, or Firm* — McAndrews, Held & Malloy, Ltd.

(57) ABSTRACT

In one embodiment of the invention, an apparatus for electrostatic discharges (ESD) events monitoring incorporating a charged device model event simulator (CDMES) unit comprises: at least one antenna positioned in a process area; an ESD detector coupled to said at least one antenna; said ESD detector wirelessly coupled to said CDMES unit; and said ESD detector calibrated for different discharge energies generated by said CDMES unit.

19 Claims, 10 Drawing Sheets

(56) References Cited

U.S. PATENT DOCUMENTS

| | | | |
|---|---|---|---|
| 5,912,184 | A | 6/1999 | Young |
| 5,923,160 | A * | 7/1999 | DeChiaro .......... G01R 29/0814 324/457 |
| 6,563,316 | B2 | 5/2003 | Schauwecker et al. |
| 2001/0056340 | A1 | 12/2001 | Gorin et al. |
| 2005/0258842 | A1* | 11/2005 | Maloney ....................... 324/750 |
| 2006/0097337 | A1* | 5/2006 | Haji-Sheikh et al. ........ 257/462 |
| 2007/0052425 | A1 | 3/2007 | Kraz |
| 2007/0139050 | A1 | 6/2007 | Ivanov et al. |
| 2007/0164747 | A1* | 7/2007 | Maloney ....................... 324/382 |
| 2007/0217101 | A1* | 9/2007 | Carter .................. H04M 19/08 361/54 |
| 2009/0167313 | A1 | 7/2009 | Kraz |
| 2010/0165537 | A1 | 7/2010 | Maloney et al. |
| 2011/0238345 | A1* | 9/2011 | Gauthier .............. G01R 31/002 702/64 |
| 2015/0160282 | A1* | 6/2015 | Candela ............... G01R 31/025 324/551 |

OTHER PUBLICATIONS

T.J. Maloney, "Antenna Response to CDM E-fields", 2012 EOS/ESD Symposium, Sep. 2012, pp. 269-278.

T.J. Maloney "Pulsed Hertzian Dipole Radiation and Electrostatic discharge Events in Manufacturing" 2013 IEEE Electromagnetic Compatibility Magazine, vol. 2, Qrtr 3, pp. 49-57.

RF Test Sets: E &H Near Field Probes Model 7405, EMC Test Systems, L.P.—An ESCO Company (Jun. 1999).

Notification of Transmittal of the ISR and the Written Opinion of the ISA, or the Declaration for PCT/US2013/078038 (Apr. 16, 2014).

International Search Report for PCT/US2013/078038 (Apr. 16, 2014).

Written Opinion of the International Searching Authority for for PCT/US2013/078038 (Apr. 16, 2014).

D. M. Taylor, P.E. Secker "Industrial Electrostatics" published by Research Studies Press LTD. 1994, chapter 8.3, pp. 242-243).

D.M. Taylor and P.E. Secker, "Industrial Electrostatics" published by Research Studies LTD. 1994, chapter 8.3, pp. 242-243.

* cited by examiner

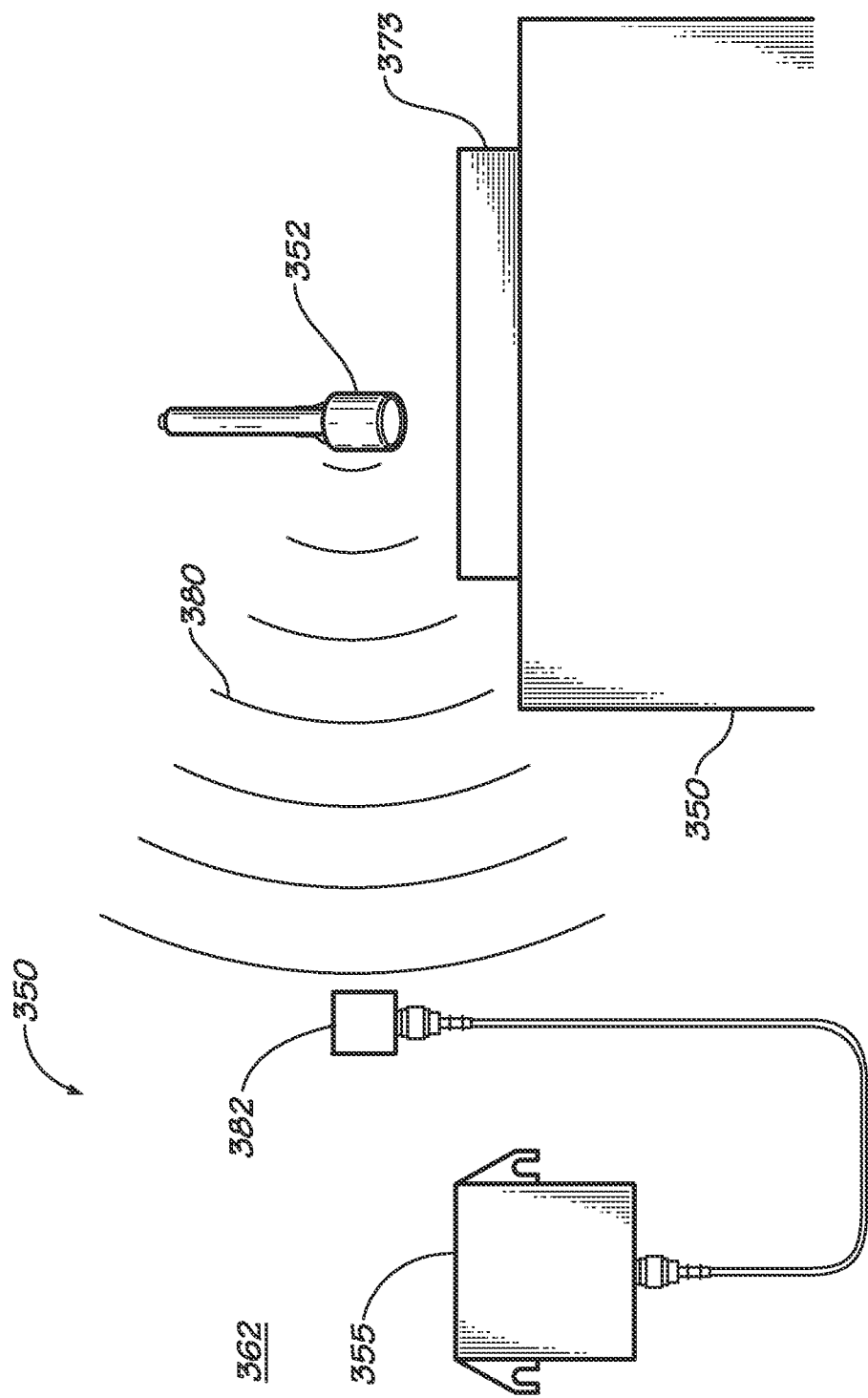

IN-TOOL ESD EVENTS MONITORING METHOD AND APPARATUS

CROSS-REFERENCE TO RELATED APPLICATIONS

This application claims priority to and the benefit of U.S. Provisional Application No. 61/747,199.

TECHNICAL FIELD

Embodiments of the invention relate generally to a method and apparatus for in-tool monitoring and characterization of electrostatic discharge (ESD) events, and/or to a CDMES/MiniPulse apparatus and method, and/or other types of charged device model event simulators (CDMES), detectors, and methods. The at least one method and apparatus disclosed herein provide real time ESD events monitoring in, for example, integrated circuits (ICs) production tools and/or different processes and assist to prevent ESD related failures using one or more method(s) of the charged device model (CDM). One method of monitoring ESD events and two methods for calibrating the monitor are disclosed herein.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

CDM events represent electrostatic discharges which happen in manual and automated production systems for electronic ICs. In production tools the IC may acquire electrical charges by many ways, such as, for example, by contact, friction, and/or induction from a nearby electrical field just to mention a few possible ways. When conductive parts of ICs come into contact with grounded equipment parts or parts with lower electrical potentials, the accumulated IC charges are free to discharge spontaneously. As a result, a relatively high discharge current (ESD event) may destroy or damage IC (see, e.g., FIGS. 1a and 1b).

The design of IC components usually incorporates special means (or particular components) for protection against ESD effects. The semiconductor industry has developed several standard methods for testing IC devices and defined their CDM ESD threshold parameters such as, e.g., withstand voltage and current amplitude. The applicable standards also detail the test apparatus requirements for automated IC CDM tests. These methods and devices are useful during IC designing stages, final testing for product certification, and failure analyses of damaged devices.

However, conventional technology suffers from various constraints and/or deficiencies as will be discussed below. A goal in accordance with various embodiments of this invention is to provide a method and apparatus for real time ESD event monitoring and calibration in IC production tools and manufacturing processes.

FIG. 1a illustrates a typical discharge model 100 of charged (IC) device CDM event in a tool or processing chamber. In FIG. 1a, the MiniPulse ESD detector 105 (or another type of ESD detector 105) intercepts the electromagnetic waves 140, and the Robot Placement Effector 115 (or another suitable type of robotic arm 115) places a charged device 125 into a test socket 130. The test socket 130 is typically placed on a suitable test bed 131, base 131, or another suitable platform 131. As the charged device 125 approaches the test socket 130, a discharge (ESD) occurs and the antenna 135 (coupled to the MiniPulse Detector 105) intercepts the waves 140 of the discharge event. In this example, the ESD event is a discharge 141 that takes place in a form of a spark between two conductive parts 125 and 130 that both differ in voltage potential. The conductive parts 125 and 130 and other semiconductor processing equipment may be in a tool or processing chamber 132 that may have any suitable size such as, for example, approximately 2×2 feet, 4×4 feet, or other dimensions.

A current problem with conventional technology is in the difficulty in calibrating an ESD detector. This difficulty is due to, for example, the challenge in providing the repeatability of the discharge events themselves. Other difficulties exist due to conditions imposed upon the radiated electrical field waveform by the materials and configuration of the process point itself. Therefore, the current technology is limited in its capabilities and suffers from at least the above constraints and deficiencies. Embodiments of the invention provide systems and methods for overcoming the difficulties in calibrating the ESD detectors.

FIG. 1b shows a screen shot of a typical example voltage/current waveform of a CDM electrostatic event where a discharge takes place in a form of a spark between two conductive parts. The top waveform 180 is an example output signal (current pulse) that is similar to an example output signal that is produced by a CDMES (Charged Device Model Event Simulator) as will be discussed below in accordance with an embodiment of the invention. The lower waveform 185 is an example MicroESD antenna 135 response to an incident propagating field.

In FIG. 1b, the top waveform 180 shows a pulse signal that is similar to a pulse signal that can also be generated and/or simulated from a CDMES device to be discussed below in accordance with an embodiment of the invention. The bottom waveform 185 shows the radiated signal being detected by the antenna 135 coupled to the MiniPulse detector 105. The MiniPulse detector 105 includes an electronic circuit that is capable of receiving the signal that is intercepted by the antenna 135. The electronic circuit will classify this signal as an ESD event 110 if the electronic circuit determines that this signal is an ESD event of interest based upon an ESD voltage and pulse duration threshold levels as also discussed below.

SUMMARY

In one embodiment of the invention, an apparatus for electrostatic discharges (ESD) events monitoring incorporating a charged device model event simulator (CDMES) unit, includes: at least one antenna positioned in a first process area; an ESD detector coupled to said at least one antenna; said ESD detector wirelessly coupled to said CDMES unit; and said ESD detector calibrated for different discharge energies generated by said CDMES unit.

In yet another embodiment of the invention, a method for electrostatic discharges (ESD) events monitoring incorporating a charged device model event simulator (CDMES) unit, includes: detecting a discharge energy; and calibrating an electrostatic detector for different discharge energies.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

Non-limiting and non-exhaustive embodiments of the invention are described with reference to the following figures, wherein like reference numerals may refer to like parts throughout the various views unless otherwise specified.

FIG. 3b is a diagram of a system (or apparatus) including a charged device model event simulator, and wherein the system is configured to also provide a calibration method for an ESD event detector, in accordance with an embodiment of the invention.

DETAILED DESCRIPTION OF PREFERRED EMBODIMENTS

Figure 1A:
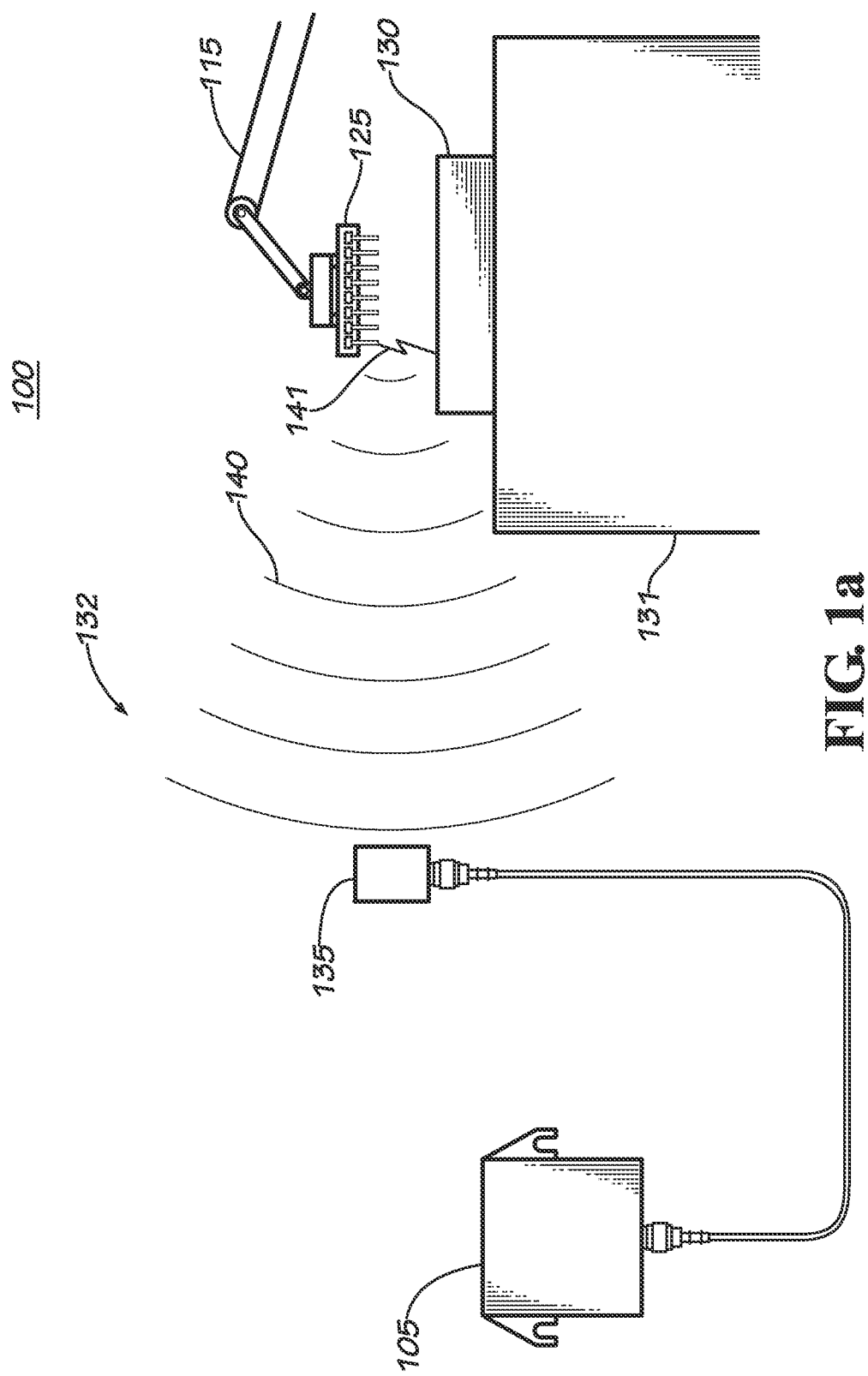
FIG. 1a is a diagram of a typical discharge model of charged (IC) device CDM event in a tool or processing chamber.

In the description herein, numerous specific details are provided, such as examples of components, materials, parts, structures, and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, structures, and/or the like. In other instances, well-known components, materials, parts, structures, methods, or operations are not shown or described in detail to avoid obscuring aspects of embodiments of the invention. Additionally, the figures are representative in nature and their shapes are not intended to illustrate the precise shape or precise size of any element and are not intended to limit the scope of the invention.

Those skilled in the art will understand that when an element or part in the drawings is referred to as being "on" (or "connected" to or "coupled" to or "attached" to) another element, it can be directly on (or directly attached to) the other element or intervening elements may also be present. Furthermore, relative terms such as "inner", "outer", "upper", "above", "lower", "beneath", "below", "downward", "upward", "toward", and "away from" and similar terms, may be used herein to describe a relationship of one element relative to another element. It is understood that these terms are intended to encompass different orientations of the device in addition to the orientation depicted in the figures.

Although the terms first, second, and the like may be used herein to describe various elements, components, parts, regions, layers, chambers, and/or sections, these elements, components, parts, regions, layers, chambers, and/or sections should not be limited by these terms. These terms are only used to distinguish one element, component, part, region, layer, chamber, or section from another element, component, part, region, layer, chamber, or section. Thus, a first element, component, part, region, layer, chamber, or section discussed below could be termed a second element, component, part, region, layer, chamber, or section without departing from the teachings of the present invention.

Additionally, the elements illustrated in the figures are schematic in nature and their shapes are not intended to illustrate the precise shape of an element of a device and are not intended to limit the scope of the invention. Furthermore, based on the discussion of the embodiments of the invention as presented herein, those skilled in the art will realize that the positions and/or configurations of the components in the drawings can be varied in different sizes, different shapes, different positions, and/or different configurations. Therefore, various components shown in the drawings can be placed in other positions that differ from the configuration as shown in the drawings. The components in the drawings are illustrated in non-limiting example positions for purposes of explaining the functionalities of the embodiments of the invention, and these components in the drawings can be configured into other example positions.

The charged device model events monitoring system (or apparatus), in accordance with an embodiment of the invention, was developed under consideration that, in general, semiconductor tool processing chambers are essentially echoic chambers with relatively high electrical noise level due to surrounding metal enclosure elements.

In practical terms, each tool has unique characteristics (e.g., EMI landscape) in reflecting internal electromagnetic field radiation caused by electrostatic discharge events. The typical scenario for CDM events is that a charged IC device is discharged when it contacts a tool or process element of a different electric potential. This discharge across a dielectric gap (typically air) causes the dipole formed by the differing electrical potentials to collapse or a capacitor formed between charged IC and tool parts to collapse. An embodiment of the invention also provides an ESD event monitor, which is also referred herein as a "MiniPulse" or MiniPulse detector or ESD detector. The monitor is, for example, a low-cost event monitor for workstations, electronics production tools, processes, and mobile applications.

The resulting radiated pulse electromagnetic waveform (radiated signal) is detected by, for example, the MiniPulse detector and an antenna that is communicatively coupled to the MiniPulse detector. If the detected field voltage level of this pulse waveform is above the threshold calibrated with the Charged Device Model Event Simulator (CDMES) equipment, then the MiniPulse detector registers a significant CDM event.

The CDM events are, for example, characterized by short (typically less than approximately 4 nano-seconds) duration changes in electromagnetic field and generate, in the antenna, an induced voltage (current) rising signal with a high slew rate. Therefore, regarding in tool ESD monitoring, the detection system used should distinguish a CDM signal of interest from general tool noise in an echoic chamber environment.

According to various embodiments of the invention, calibration methods for ESD detectors are provided. A suitable equipment such as, for example, a CDMES device known in the art, may be used to simulate CDM events, and a calibration method is then performed according to an embodiment of the invention. For example, in situ monitoring of CDM events is facilitated by simulating a group of spark gap discharges in the real tool at the point where IC devices contact conductive tool elements. The collapsing charged capacitor discharge simulates CDM events at a pre-selected voltage threshold value for a given IC device. When this procedure is completed, the tool can be said to be calibrated for IC CDM ESD event detection at the specified level.

Different types of CDMES devices that are known or that would be developed in the future may be used to simulate CDM events, and a calibration method according to an embodiment of an invention is performed after simulating a CDM event or different discharge energies.

The CDMES is configured in several embodiments as a device with an open moving electrode in the discharge gap, or a mercury or RF relay or high voltage RF relay, for example, reed relay.

The CDM event simulated discharges generate signals that are intercepted and detected in the receiving antenna of the monitoring device (MiniPulse). The MiniPulse antenna (MicroESD antenna) is coupled to the MiniPulse (see FIG. 3b) and permits the MiniPulse to receive the waveforms due to an ESD event. The MiniPulse can be calibrated in situ by varying the CDMES discharge voltage and/or the position of the MiniPulse antenna with respect to the expected CDM event source.

Therefore, the CDMES is charged device simulator that creates a known radiated spark that is similar to a discharge occurrence when a charged device is approaching or contacting a socket. This CDMES is used to calibrate the MiniPulse. A DC power supply is coupled to the CDMES, and any suitable power supply voltage values (e.g., 100V, 200V, 500V, or other values) are driven into the CDMES. When an ESD event is simulated, the antenna detects the waveform from the CDMES-created discharge, and the MiniPulse captures and processes the waveform detected by the antenna. An example of a waveform due to a CDMES-created discharge is observed in the oscilloscope as shown, for example, in FIG. 1b, as also further discussed below.

Based upon a calibration plot and known product CDM failure thresholds, the ESD threshold voltage level may be set up (or otherwise configured) for the MiniPulse detector. The output alarm signal from the MiniPulse will be generated and may be sent to a tool control system if CDM events exceed the threshold level for real IC discharge events in the tool.

The CDM Event Simulator has been designed to allow ESD monitors (detectors) to be calibrated inside the tools and processes where CDM events occur. This simulation device allows the creation of calibrated CDM events of different voltage amplitudes to be produced at the point where production devices are most vulnerable and where ESD monitoring sensors are located. This approach allows the highest level of handling safety for sensitive devices.

CDM Event Simulator (CDMES)

The IC devices are usually characterized for failure thresholds in formal test beds and machines designed to simulate discharges on the various device input and output connections. This information is used to assess risk during all phases of device manufacture and system integration. In an embodiment of the invention, a method is provided by using an ESD event monitoring device and failure threshold information in conjunction with the CDM Event Simulator (CDMES).

Figure 1B:
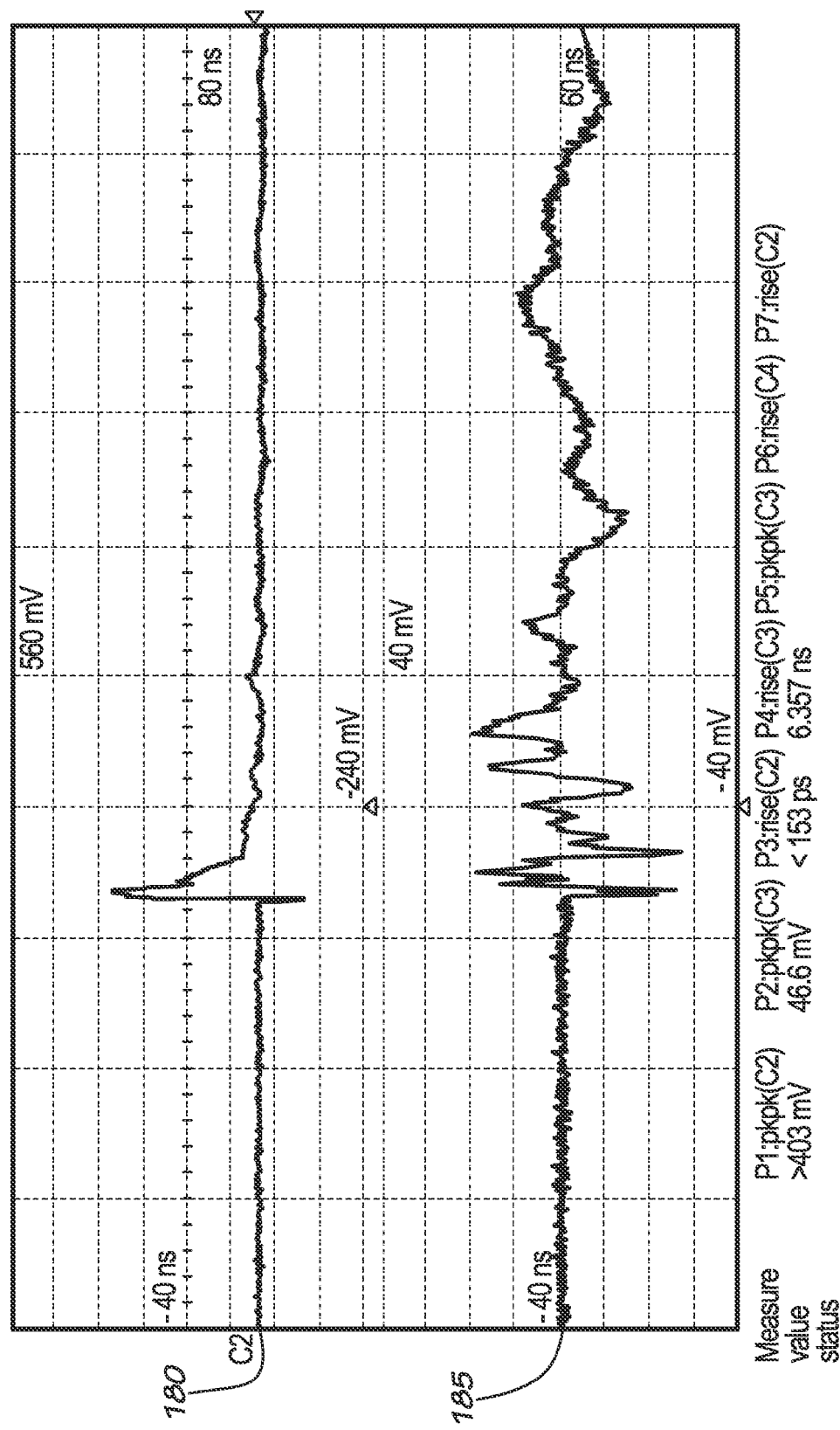
FIG. 1b is screen shot of a waveform diagram of a typical example voltage/current waveform of a CDM electrostatic event where a discharge takes place in a form of a spark between two conductive parts.

Many applications in, for example, semiconductor, disk-drive, FPD, automated IC handling, and a host of other manufacturing processes handle sensitive product in locations where direct discharges (electrostatic discharge between IC pins and grounded conductors) can occur (see FIGS. 1a and 1b as an example).

Figure 2:
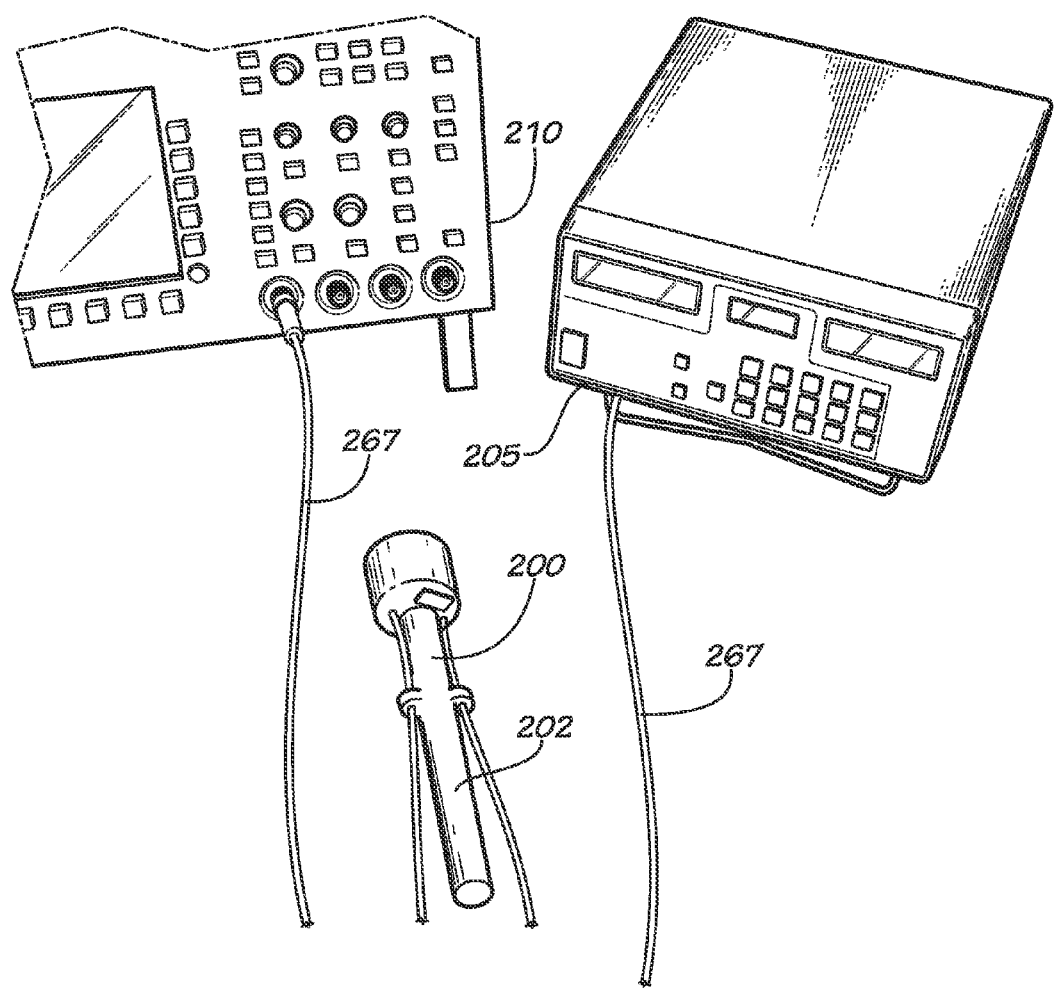
FIG. 2 is a diagram of a general view of charged device model event simulator with an external HVPS (high voltage power supply) and scope, in accordance with an embodiment of the invention.

Simulating CDM events at the point (or area) of monitoring has posed challenges when attempting to use actual charged devices. Part of this difficulty concerns repeatability of the discharge events themselves. Other difficulties exist due to conditions imposed upon the radiated electrical field waveform by the materials and configuration of the process point itself. Two versions of the CDM Event Simulator provide repeatable CDM calibration events at the process point which takes into account uncharacterized location conditions (a general view of CDM Event Simulator version 1 is seen in FIG. 2.

It is also noted that the systems and methods discussed herein (with the various CDMES and MiniPulse Detector) may be used in a tool or processing chamber and may also be used in an open work bench, any tabletop, a real environment, or any other suitable environment where a calibrated CDM is radiated (is created) and detected for purposes of calibrating an ESD detector.

CDMES Version 1: Mechanical Gap to generate CDM Event:

The first version of the CDM Event Simulator (CDMES) uses a mechanical gap control to simulate a collapsing capacitor event to simulate the electrostatic discharge which occurs between a charged IC and either an object (target) at a different electrical potential or a ground reference. Specifically, this embodiment models the Charged Device Model (CDM) discharge type which is characterized by a fast single-peak pulse waveform of transferred current between the device and ground. The CDMES power circuit incorporates high resistance (up to, for example, approximately 100 mega Ohms or more) so that the voltage across the gap is high (approximately 25V-3000V range) and applied current is less than 10 micro amperes across this range.

Electrostatic discharge would occur for an arbitrary charged contact and typical ground contact (see FIGS. 1a and 1b). Therefore, when the CDMES is charged with a power supply voltage, the CDMES will simulate an ESD event that generates a pulse waveform that is detectable by and reproduced in an oscilloscope.

The CDM pulse as reproduced on the oscilloscope is a graph of the current pulse waveform and corresponds to the classical CDM waveform referenced in all standards documents (IEC 61000-4-2, ISO10605, JESD22-C101E). The produced waveform also corresponds to the input CDM pulse waveform which formal device test machines (see standards reference above for examples) use to evaluate device ESD susceptibility.

FIG. 2 is a general view of a charged device model events simulator 200 with a discharge head 202 that is electrically coupled to an external HVPS (high voltage power supply) 205 and scope 210.

Figure 3A:
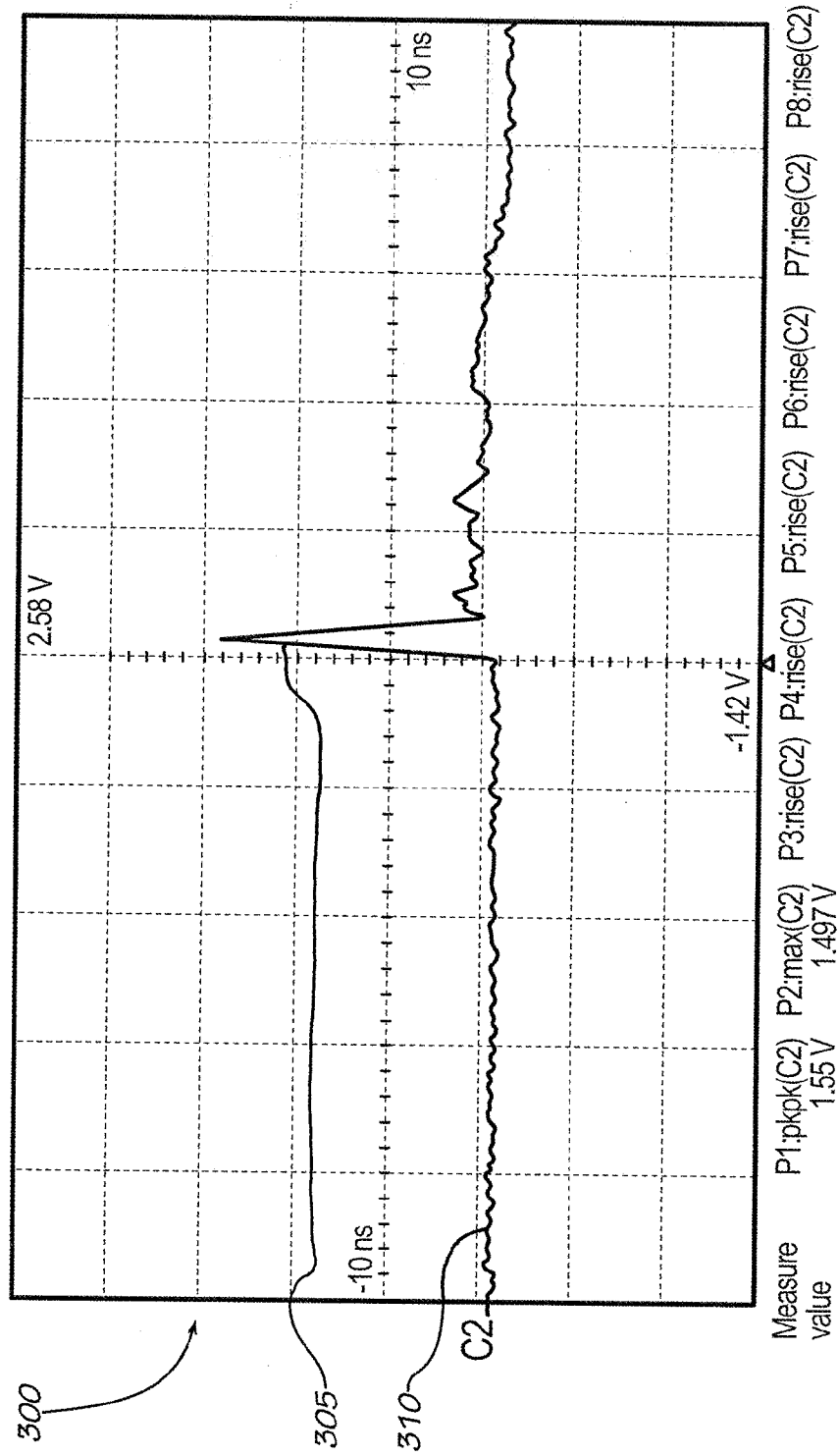
FIG. 3a is a block diagram of CDMES pulse waveform representing a typical current pulse produced when a CDMES is triggered, in accordance with an embodiment of the invention.

FIG. 3a is a typical CDMES pulse waveform representing discharge current pulse produced when a CDMES is triggered. In this example of the oscilloscope screen shot 300, a voltage discharge of, for example, approximately 100V from the HVPS 205 will trigger the CDMES to produce a typical current pulse 305 in the waveform 310. This typical current pulse 305 will cause an electrostatic event where a discharge takes place in a form of a spark between two conductive parts.

FIG. 3b is a diagram of a system 350 (or apparatus 350) including a charged device model event simulator 352 (or CDMES 352 or CDMES unit 352), and wherein the system 350 is configured to also provide a calibration method for an ESD event detector 355, in accordance with an embodiment of the invention. Therefore, FIG. 3b illustrates a depiction of CDMES ESD calibration for MiniPulse ESD Event Detector 355. The ESD simulation performed by the CDMES 352, and a calibration method for the ESD event detector 355, may be in real tool or processing chamber 362 (in-situ). However, as mentioned above, embodiments of the CDMES may instead be used in an open work bench, any tabletop, a real environment, or any other suitable environment where a calibrated CDM is created and detected for purposes of calibrating an ESD detector.

As similarly discussed with reference to FIG. 2, the CDMES 352 is coupled with (and operate with) the HVPS 205 and the scope 210. The CDMES 352 is electrically coupled via the electrical link 266 (e.g., cable) to the power supply 205 for supplying voltage to the CDMES 352. The CDMES 352 is also electrically coupled via the electrical link 267 (e.g., cable) to the oscilloscope 210 which detects and measures the output signal (current pulse) (see output signal 310 in FIG. 3a) that is produced by the CDMES device 352 as discussed further below. When the trigger button is pressed, the CDMES 352 (CDMES unit 352) uses the voltage from the HVPS 205 and an internal ESD event generating mechanism to produce a current pulse event.

The discharge head (of CDMES 352) is charged by the voltage from the HVPS 205. The antenna 382 (coupled to the ESD detector 355) intercepts the radiation 380 (or electromagnetic waves 380) of the discharge event generated within the CDMES 352. The antenna 382 is configured to detect the different discharge energies in the radiation 380. As also mentioned above, the simulation of the ESD event by use of the CDMES 352 and corresponding elements (e.g., HVPS 205, scope 210 and ESD detector 355) may be performed in the chamber 362 or may be performed outside of the chamber 362 (i.e., may be performed in an open work bench, any tabletop, a real environment, or any other suitable environment where a calibrated CDM is created and detected for purposes of calibrating an ESD detector 355).

This drawing of FIG. 3b shows radiation 380 in the direction of the NULL field, as the antenna 382 is along the axis of and perpendicular to the radiating element (discharge head) of CDMES 352. Any signal will be largely due to reflections. If the CDMES 352 were rotated approximate 90 degrees CCW the signal would be significantly affected.

The CDMES 352 is discharged at the point where normal device handling occurs, simulating a device CDM discharge event. The ESD detector 355 (MiniPulse 355) has a relay output to inform a tool control system of ESD events.

A gate detect input in the ESD detector 355 is a Test Point which may be utilized to setup the ESD trigger threshold level of the MiniPulse 355, where an ESD trigger threshold level will distinguish ESD events of interest.

The relay output of the ESD detector 355 may be used to monitor the MiniPulse Alarm status (of Minipulse 355). The relay output is, for example, an open collector driver which is pulled to ground concurrently with the audible alarm sounding from the MiniPulse 355.

During the process of calibrating the MiniPulse detector 355 (FIG. 3b), various supply voltage values (e.g., approximately 20V, 100V, 500V, or other values) and the collapsing capacitor of CDMES 352 allows the user to simulate the desired ESD event strength.

This method of CDM calibration disclosed herein in an embodiment of the invention has a number of possible benefits that may be one or more of the following.

Ability to calibrate ESD sensors in tools and processes where they will be used rather than solely through laboratory calibration or rough approximation routines.

CDM simulation in-situ takes into account variable conditions which affect sensor calibration automatically.

Allows statistical verification of ESD sensor effectiveness through ease of high repetition event simulation.

Allows device handling tools to be calibrated for CDM discharge events during the tool development process.

Allows ESD detector periodic calibration in place, removing necessity of removing detectors from the tool or process for laboratory calibration.

The main advantages of this version of the CDMES include one or more of the following:

A smaller radiating antenna allows use in more constrained tool spaces.

The CDM simulated events have less variation due to the elimination of the manual trigger interface of the first version of the CDMES (i.e., triggering is done with a discrete timed switch).

ESD Event Detector

Many applications in semiconductor, disk drive, FPD, automated IC handling, and a host of other manufacturing processes operate with ESD sensitive products in locations which are difficult to monitor/control directly. In addition, many of these environments by their nature are saturated with EMI noise sources ranging from HVDC supplies, electrical motors, and actuators to broadband communication (RF) units. Detecting ESD events at specific points related to product handling can be challenging.

The four main features of the novel ESD events detector are:

1. Controlling ESD detection by pulse slew rate and duration in the nanosecond range. The "MiniPulse" detector 355 (FIG. 3b) is able to discriminate between different pulse event types. This allows it to determine and select valid ESD-type events from other EMI (electro-magnetic interference or emission) pulse packet signals (e.g., signal discharges from motors, switching devices, cell phone, televisions, WiFi, environmental noises, etc.). Therefore, the MiniPulse detector 355 determines if an ESD pulse event fits within a selected pulse event threshold so that the MiniPulse detector 355 can determine if that ESD pulse event falls within the CDM charged device model instead of the machine model and human model. As known to those skilled in the art, ESD events in the charged device model, the machine model, and the human model will differ in resistance factors, capacitance factors, and signatures. Although an embodiment of the MiniPulse detector 355 does not actually indicate the difference between CDM, HBM and MM type ESD events, the MiniPulse detector 355 decides trigger validity based upon signal amplitude over the trigger threshold and whether the pulse event fits within the time buffer (i.e., qualifying as a pulse).

2. Adjustable discharge energy Threshold Control. Due to electromagnetic field attenuation over distance, many wider-area ESD events can be filtered out by adjusting the voltage sensitivity threshold to match local event amplitudes (e.g., thresholds of 1 volt, 100 volts, 500 volts, or other values).

3. An ESD detection method is now discussed in accordance with an embodiment of the invention. ESD events produce electromagnetic pulses. This pulse is formally described as an electromagnetic radiation flux density which radiates outward in a spherical shape from the source, with radiated energy decreasing as the wave progresses away from the source. The MiniPulse 355 samples this expanding field through interaction with a dipole antenna through inductive field coupling. The energy of the expanding electric field couples to the antenna producing a signal on the antenna cable. The MiniPulse detector unit 355 demodulates the incoming signal on the cable, decomposing the various frequencies into their power components. The MiniPulse 355 measures the combined power (Watts) of the radiated pulse transient to determine if it is greater than the detection threshold set. If so, the MiniPulse 355 triggers on an event of interest. If the power level is below the set threshold for detection, the event is ignored. In addition, the Mini Pulse detector 355 also samples the incoming signal for pulse duration using a comparator circuit (see comparator 508 in FIGS. 5 and 6) to determine if the pulse qualifies as a likely ESD event. If the pulse duration is within the time interval boundaries typical for CDM and other ESD events (HBM and MM), the pulse triggers the detector. This method of detection is different from standard time-domain (versus frequency domain) signal analysis. Time domain measurements, such as those made with high speed, wide-bandwidth oscilloscopes, typically extract a peak voltage level. The MiniPulse 355 works more like a spectrum analyzer which extracts the power of the ESD event signal. The main advantage of this approach is in economy of detection hardware. The need for high speed sampling (as in the time-domain method) is not crucial. The radiating pulse power across the signal frequencies gives a very good first order approximation of the signal power, enabling a comparison to be made between different ESD event amplitudes.

4. The "MiniPulse" energy threshold control sensitivity allows fine tuning down to very small acquisition areas. This is an important aspect of limiting detected ESD events to only those of critical importance and/or those of interest to the user.

5. Antenna configuration. Another key factor in ESD event detection to a specific process point is the form and placement of the antenna 382 (FIG. 3b). The physical gain characteristics of the antenna 382 play a significant part in controlling ESD signal acquisition. The directional gain feature of the specifically designed antenna (coupled to the MiniPulse detector 355) can be used to calibrate the MiniPulse detector 355 for given ESD events of interest to the user.

6. Antenna performance and noise insensitivity. The MicroESD antenna 382 (or micro antenna 382) was specifically designed for electrostatic discharge (ESD) event detection. The engineered characteristics allow ESD radiated energy to be directionally detected for source location while ignoring other nearby events not of interest.

Specific improvements of embodiments of the invention over conventional technology (U.S. Pat. No. 6,563,316 and patent application US2009/0167313) and other available ESD event monitoring products:

1. A demodulating log amplifier 505 (FIG. 5) extracts multi-frequency amplification levels from the detected ESD signal. This allows the "MiniPulse" 355 to discriminate signal levels for threshold control more accurately. Therefore, embodiments of the invention provide a demodulating log amplifier 505 that operates in a measurement mode and generates an output signal that is matched with a selected threshold for discriminating signal levels. This technology has not been used by other detector products on the market.

2. The specifically designed antenna 382 to be used with this product ("MicroESD" antenna 382) uses engineered gain characteristics for optimal detection at specified ranges while excluding undesired signal sources. The physical dimensions and construction of this antenna have been bandwidth optimized for electrostatic discharge (ESD) radiated pulse transient signals. Other detectors on the market use standard multi-use RF antennas with unnecessary wide-band characteristics. This approach by detectors on the market makes signal separation between ESD pulse transient events and other EMI signal sources highly problematic.

3. Method in-situ ESD monitor calibration to detect a specific type of ESD event are now possible. Therefore, embodiments of the invention can be placed into tools and applications (or other specific areas) in order to detect specific pulse events and exclude other signals not of interest. In contrast, current ESD event detectors are designed to detect ESD events in general without the above-mentioned advantages of the embodiments of the invention.

Figure 3C:
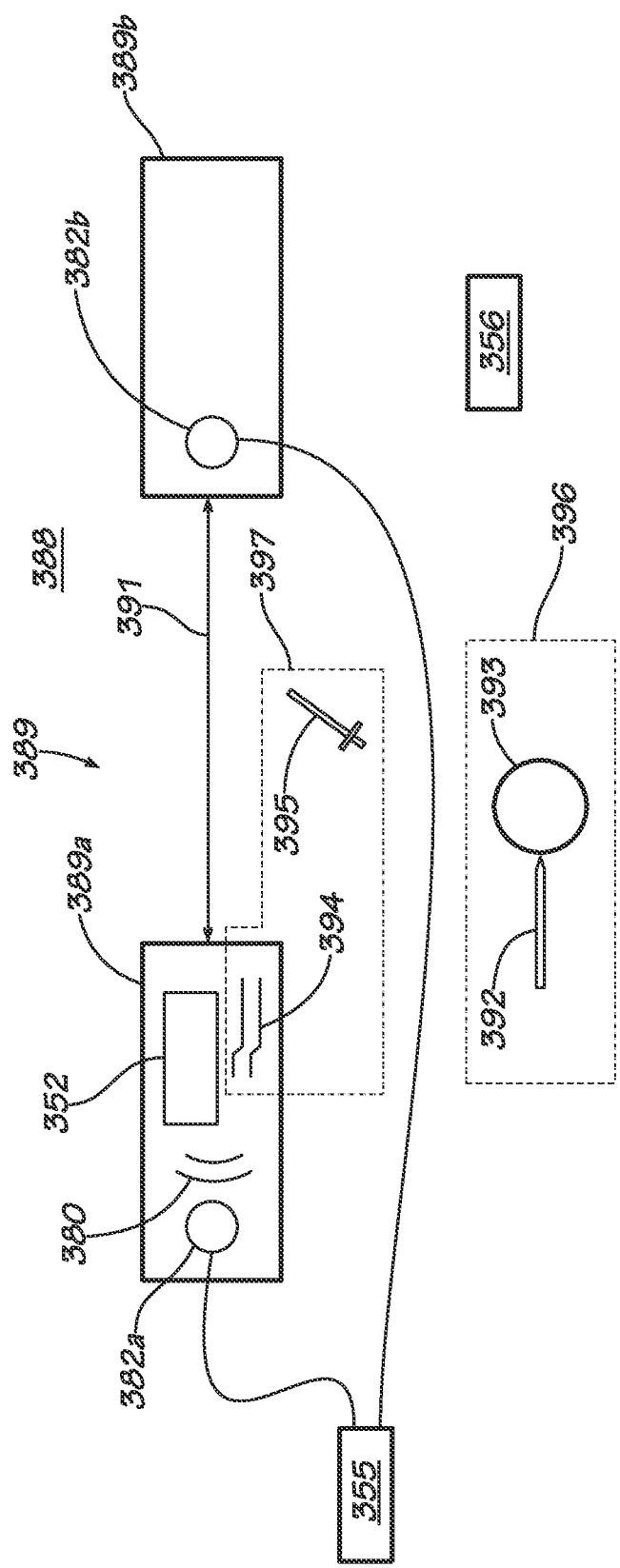
FIG. 3c is a diagram of a system (or apparatus), in accordance with another embodiment of the invention.

FIG. 3c is a diagram of a system (or apparatus) 388, in accordance with another embodiment of the invention. The system 388 is shown in a top plan view for purposes of clarity of discussion. As similarly discussed with regard to the system 350 in FIG. 3a, the system 388 is configured for electrostatic discharges (ESD) events monitoring and incorporates a charged device model event simulator (CDMES) unit.

In an embodiment of the invention, the system 388 includes at least one antenna 382a that is positioned in a process area 389a, and an ESD detector 355 coupled to the antenna 382a. Since the antenna 382a is configured to receive the radiation 380 from a CDMES unit 352, the antenna 382a is wirelessly coupled to the CDMES unit 352. The ESD detector 355 is calibrated for different discharge energies generated by the CDMES unit 352.

The process area 389a may be, for example, a tool process area or an area external to a tool process area.

In another embodiment of the invention, a process area (generally shown as area 389) includes a first process area 389a and a second process area 389b. The first antenna 382a is positioned in the first process area 389a and a second antenna 382b positioned in the second process area 389b.

In an embodiment of the invention, the first antenna 382a is coupled to the ESD detector 355 and the second antenna 382b is also coupled to ESD detector 355. In another embodiment of the invention, the second antenna 382b is coupled to another ESD detector 356 and is not coupled to the ESD detector 355.

Typically, the first process area 389a is separated from the second process area 389b by a distance 391, and the first antenna 382a and second antenna 382b form multi-channels. The distance 391 is adjustable.

In one embodiment, the first antenna 382a and second antenna 382b may be similar in an antenna response sensitivity. In another embodiment, the first antenna 382a and second antenna 382b are different in antenna response sensitivities.

The process areas 389 may vary in number from one or more process areas. Therefore, more than two process areas may be included in the system 388.

At least one of the process areas 389 may include a socket 373 (FIG. 3b) that is configured to receive a semiconductor chip 125 (FIG. 1a), or may include a plurality of sockets 373 that are configured to receive a plurality of semiconductor chips.

At least one of the process areas 389 may include a tweezer 392 that is configured to receive a wafer 393 in another embodiment as best identified by reference 396. Of course, the tweezer 392 may be another type of wafer processing tool 392.

At least one of the process areas 389 (or wafer 393) may include conductive traces 394 that are accessible by a test probe 395 in an embodiment as best identified by reference 397. Any of the process areas 389 may be of another suitable type of area.

Micro ESD Antennas

Antennas used to detect ESD radiated pulse transients have traditionally been standard antennas with very high gain. Whereas this makes detecting ESD events quite easy, it has made it virtually impossible to determine event origins. This weakness has made traditional antennas of little use in monitoring critical processes.

For purposes of providing additional background information related to antenna-related behaviors, the following references are also cited:
1. T. J. Maloney, "Easy Access to Pulsed Hertzian Dipole Fields Through Pole-Zero Treatment", cover article, IEEE EMC Society Newsletter, Summer 2011, pp. 34-42.
2. T. J. Maloney, "Antenna Response to CDM E-fields", 2012 EOS/ESD Symposium, September 2012, pp. 269-278.
3. T. J. Maloney "Pulsed Hertzian Dipole Radiation and Electrostatic discharge Events in Manufacturing" 2013 IEEE Electromagnetic Compatibility Magazine, Vol. 2, Quarter 3, pages 49-57.

The "MicroESD" antenna 382 (e.g., the antenna 382 coupled to the MiniPulse detector 355 in FIG. 3b) was developed for the sole purpose of detecting ESD events in close proximity to their source. The MicroESD antenna 382 is embodied of various versions of designed microstrip antennas, as shown in the example antennas 405, 410, 415, 420, and/or 425 in FIG. 4a, which have excellent ESD near-field radiant pulse reception, while rejecting other near and far-field pulse signatures due to engineered directional gain characteristics. This allows the MicroESD antennas to perform well where other antennas do not in identifying localized ESD events of interest.

In addition, the designed characteristics of this antenna allow a very wide signal discrimination range (10-3000V) which is not the case with general antennas commonly used in ESD detection due to saturation effects. When used in conjunction with attenuators, very large ESD events can be captured effectively.

ESD events should preferably be monitored as close to their expected source as practical. Typical monitoring distances for the antenna installation range from, for example, approximately 1" (2.54 cm) and approximately 6" (15 cm), though other distances can be accommodated. The Micro ESD antenna 382 will purposefully become less efficient with greater distance from the source due to signal amplitude reduction and detection threshold settings.

Figure 4A:
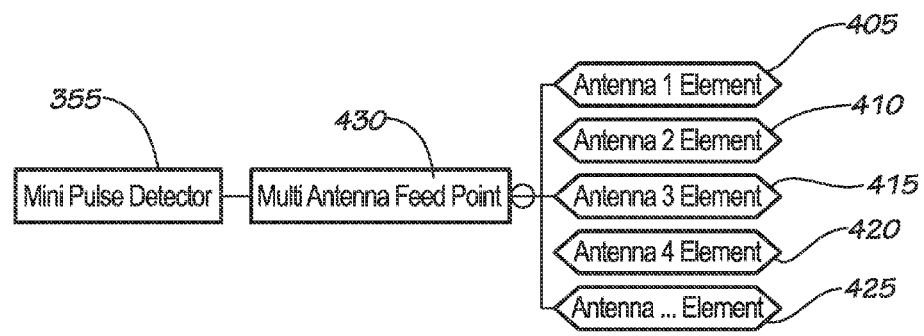
FIG. 4a is a diagram illustrating a generic multiple antenna ESD detection array, in accordance with various embodiment of the invention.

In FIG. 4a, Multiple Antenna Configurations in accordance with various embodiments of the invention are disclosed. The MiniPulse 355 can be used with multiple concurrent antennas to detect ESD signals in different places simultaneously or separately. The same ESD signal sampling method is used, with the only difference being multiple antenna feed points 430. The feedpoints 430 are communicatively coupled to the MiniPulse detector 355. Due to the nature of line propagating ESD transients and the low ohmic loss of the antenna cabling, signal degradation is insignificant for the purposes of detection and amplitude discrimination.

Multiple antennas can be deployed as arrays of dipole structures in almost any configuration. In FIG. 4a, five antennas 405-425 are shown. However, the array of dipole structured in FIG. 4a may have more than five antennas or less than five antennas.

Figure 4B:
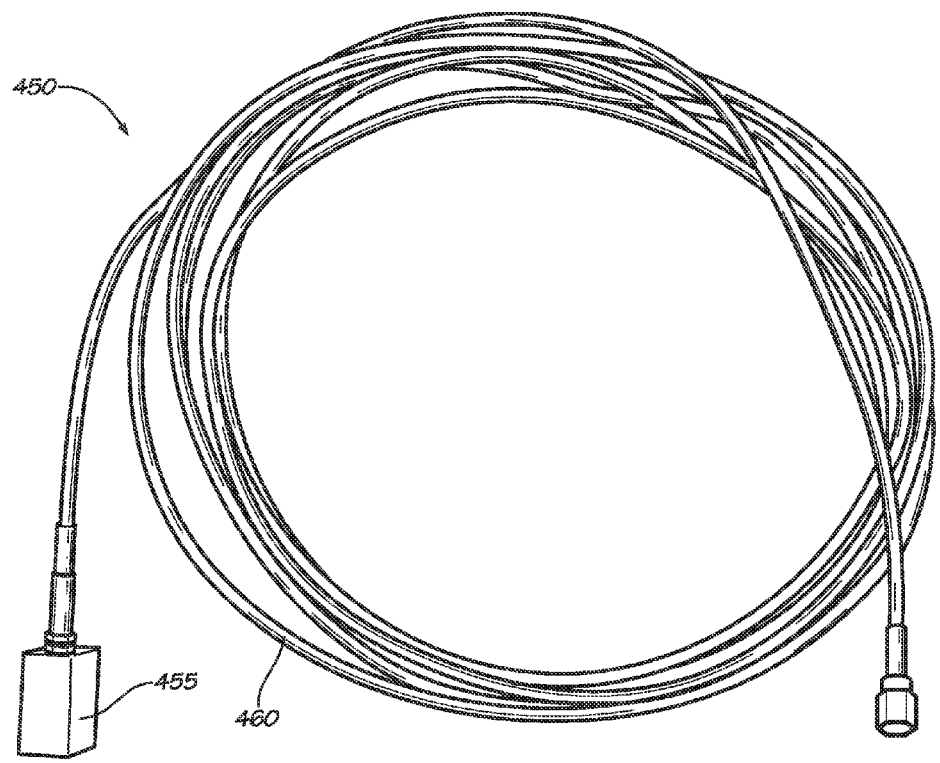
FIG. 4b is a diagram illustrating a MicroESD antenna assembly, in accordance with an embodiment of the invention.

FIG. 4b is a diagram illustrating a MicroESD antenna assembly 450, in accordance with an embodiment of the invention. The assembly 450 includes a MicroESD antenna 455 that is coupled to an electrical link 460 (e.g., a cable 460) which is removably connected to the ESD detector 355 (FIG. 3b).

Figure 5:
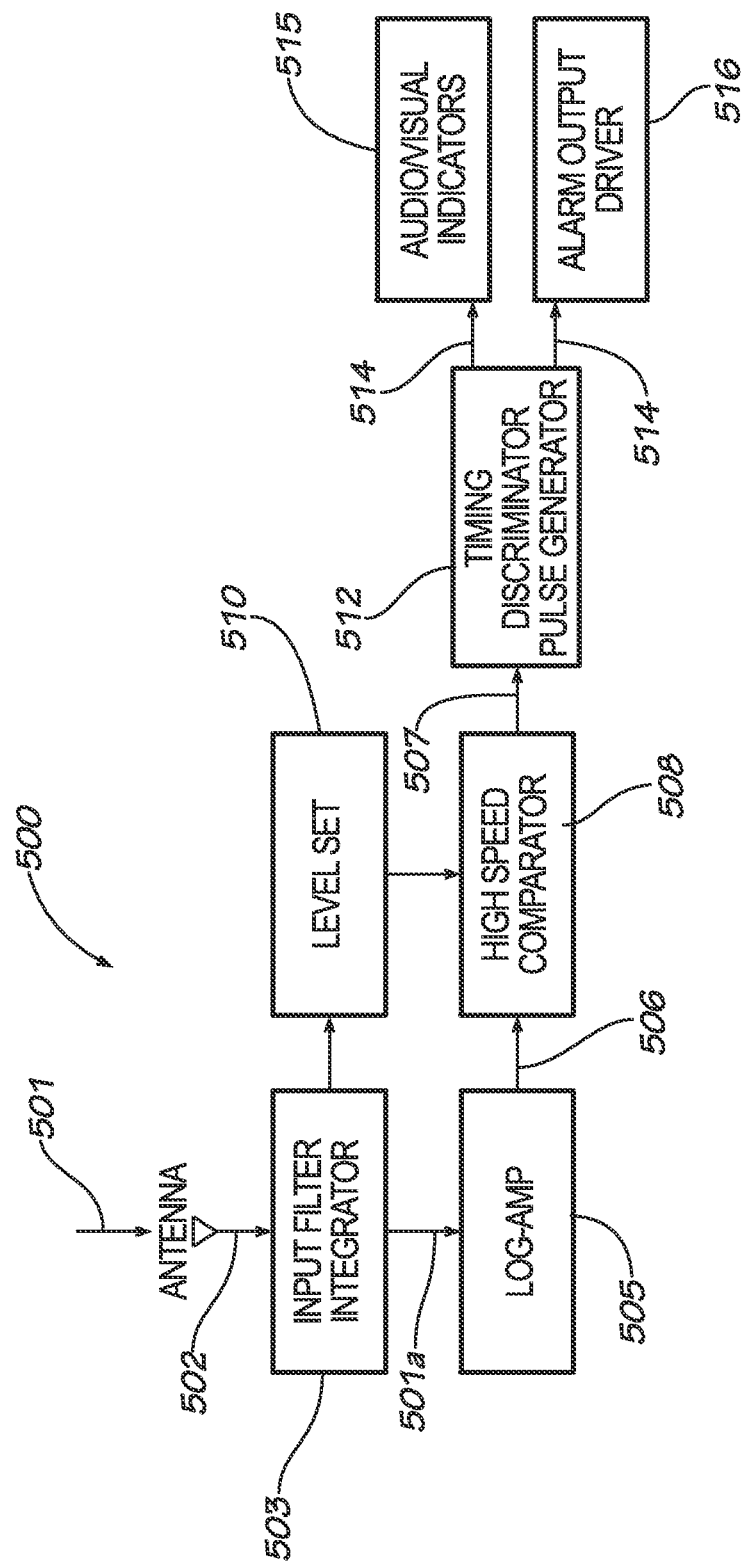
FIG. 5 is a block diagram of an ESD detector (MiniPulse), in accordance with an embodiment of the invention.
Figure 6:
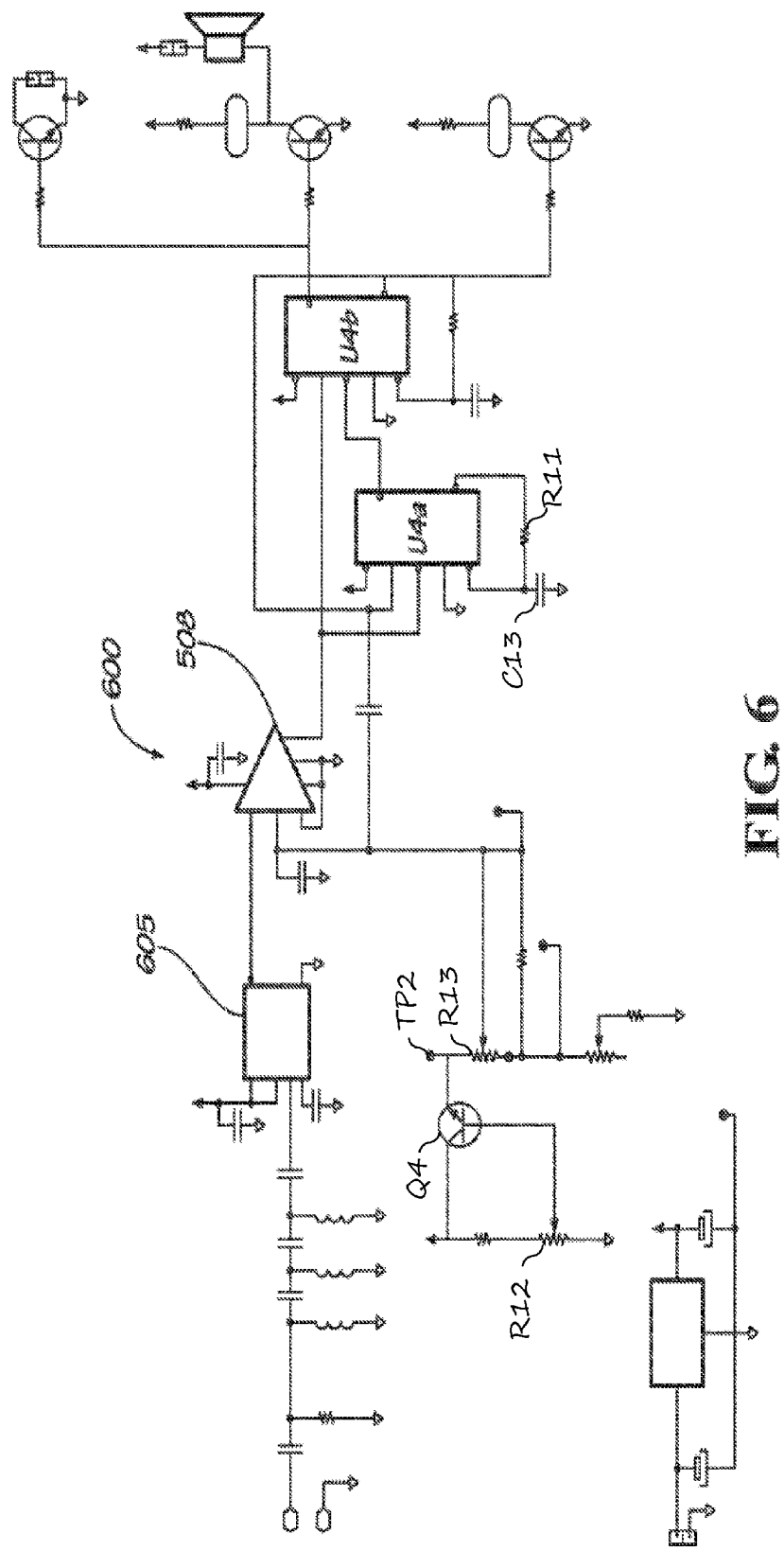
FIG. 6 is a schematic diagram of the ESD monitor circuit of the ESD detector of FIG. 7, in accordance with an embodiment of the invention.

MiniPulse Circuit Description:

Reference is now made the block diagram of FIG. 5 and the circuit diagram of FIG. 6. FIG. 5 is a block diagram of an ESD detector 500 (MiniPulse 500), in accordance with an embodiment of the invention. FIG. 6 is a schematic diagram of the ESD monitor circuit 600 in the ESD detector 600 of FIG. 5, in accordance with an embodiment of the invention. The MiniPulse 500 is also shown as (and described as) the ESD detector 355 in FIG. 3b.

The MiniPulse 500 uses a two-dimensional algorithm by analyzing EMI events in the time domain and threshold discrimination to detect pulse electrostatic discharge of certain electromagnetic energy. Through the use of specific antenna configurations and antenna placement relative to the object being monitored, the MiniPulse 500 can provide ESD event detection for specific small areas of interest or for wider area coverage.

The ESD event signal 501 is detected by an antenna 502 connected to shielded cable and attached to an input connector (e.g., an input SMA connector). The signal 501 is processed by an input filter/integrator 503 (e.g., a 6 order high-pass filter) which is tuned to pass the distorted frequencies (>100 MHz) typical of a true ESD event and reject signals outside that range. The filtered signal 501 (from the filter/integrator 503) is then passed to a log-amplifier 505, which is a very fast six stage demodulating log-amp (Analog Devices AD8310). The log-amplifier's output signal 506 is inverted in that the quiescent voltage (no input signal) is approximately 2.5V. The circuit filtered incoming signal 506 is discriminated by power, duration, and amplitude.

The stronger the input ESD event signal strength, the lower the log-amplifier's output voltage 506. Typically this signal 506 will range between approximately 2.5 and approximately 1.0 volt. The output voltage 506 is then compared to a preset DC voltage 507, using an ultra fast comparator 508 (Analog Devices AD8561).

Since the output voltage 506 is compressed to about a 1.5 volt swing, the preset DC voltage 507 is developed by a separate circuit (the level set block 510 in FIG. 5) to provide an easily settable alarm level. The maximum preset DC voltage 507 of ~2.0 volts is set by the R12 potentiometer and Q4 NPN voltage source which may be checked at TP2. The minimum preset DC voltage 507 of ~1.0 volt is set by potentiometer R10 and may be checked at TP1. Potentiometer R13 may then be adjusted through its entire mechanical range to produce preset DC 507 between ~2.0 volts and ~1.0 volt which matches the output range of the log-amplifier 505.

If the comparator (AD8561) 508 detects a signal (on the "−" or negative input) which goes below the preset DC voltage 507 (on the "+" or positive input) a negative true condition is momentarily developed on the output of the comparator 508. This pulse is then passed to U4a and U4b, a pair of one-shot multi-vibrators. U4a will be clocked on and Q=true (assuming the J input is true). When the U4a one-shot resets (due to the R11*C13 timeout, approximately 250 nSec) the second one-shot U4b will be set to Q=true only provided the output of the comparator 508 has returned high because the output of the comparator 508 is a single, sufficiently fast pulse. If a pulse is too long, e.g. >500 nSec, indicating it is not an ESD event of interest, then that pulse is ignored.

Therefore, U4b is set to Q=true only because a pulse has been determined to be an ESD event of interest. An Alarm condition is indicated by, for example, an audible tone, visual red LED and open collector output being triggered "ON".

The following block diagram and schematic of the MiniPulse 500 (FIG. 5) shows its basic operating elements. The antenna 502, which may be attached directly or remotely via coaxial or triaxial cable, detects EMI signals (e.g., signal 501). The antenna 502 is, for example, of the same type as the antenna 382 (FIG. 3b). The EMI signals are processed to detect only those in the frequency range of interest. Since the desired signals have a very large dynamic range a log-amp 505 amplifies to produce a usable signal 506. The signal 506 is then passed to a high speed comparator 508 where it is compared with a predetermined threshold voltage level 507. Signals that exceed this threshold 507 are then passed to a discriminator 512 which ignores all but those signals that meet the time definition of an EMI pulse of interest. This discriminator/generator 512 determines if the EMI pulse is a valid event by checking the slope of the EMI pulse. When triggered, the circuit 512 generates a pulse 514 which is used to indicate an EMI event audibly, visually (e.g., via audio and/or visual indicators 515), and remotely through the open collector output driver transistor 516. The alarm output driver 516 sends an output event occurrence signal to a tool or computer, in order to indicate that an event has occurred over the predetermined threshold voltage level.

Figure 7:
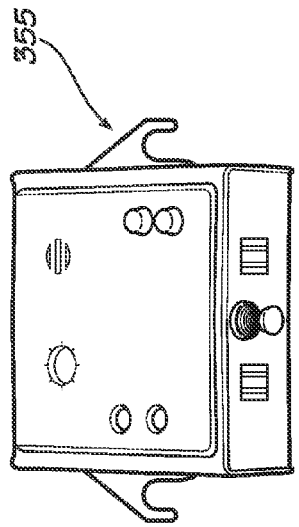
FIG. 7 shows a general view of a MiniPulse ESD detector as seen externally in one embodiment of the invention.

FIG. 7 shows a general view of a MiniPulse ESD detector 355 as seen externally in one embodiment of the invention. However, the ESD detector 355 may have another type of configuration that differs from FIG. 7.

Figure 8:
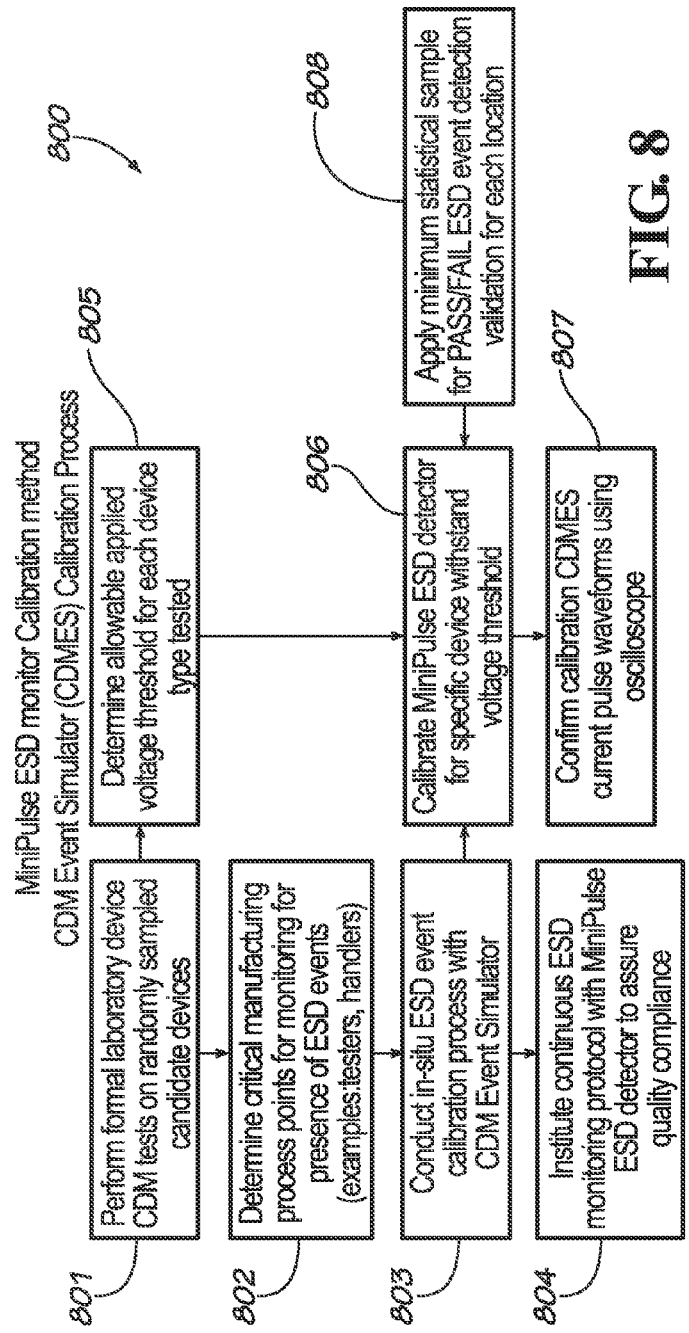
FIG. 8 is a flowchart of a MiniPulse ESD calibration process in accordance with an embodiment of the invention.

FIG. 8 is a flowchart of a calibration method 800 and implementation for an ESD detector, in accordance with an embodiment of the invention. It is noted that the order of the steps in the method 800 may vary, and some particular steps may also be performed concurrently. At 801 in the calibration method 800, formal laboratory device CDM tests are performed on randomly sampled candidate devices. At 802, a determination is performed on critical manufacturing process points for monitoring for presence of ESD events (examples: testers, handlers). At 803, in-situ ESD event calibration process is conducted with a CDM Event Simulator (CDMES). Examples of the in-situ ESD event calibration process have been described above with reference to the apparatus 350 in FIG. 3b. At 804, a continuous ESD monitoring protocol may be instituted with a MiniPulse ESD detector to assure quality compliance.

When the MiniPulse ESD detector 355 is calibrated for a specific device withstand voltage threshold, this voltage threshold will typically be set at a voltage level that is less than the actual voltage failure level of the device. For example, if a device has an actual voltage failure level of approximately 200 volts, then the voltage threshold will be set below 200 volts such as, e.g., approximately 50% of the voltage failure level or approximately 100 volts. This approach prevents actual damages to occur in devices. Therefore, at 805, an allowable applied voltage threshold is determined for each device type to be tested.

At 808, a minimum statistical sample is applied for PASS/FAIL ESD event detection validation for each location. For example, about 20 or 30 shots, or other number of shots, are applied to obtain accurate calibration.

At 806, an ESD detector 355 (e.g., a MiniPulse detector) is calibrated for specific device withstand voltage threshold. It is noted that after the procedures in blocks 803, 805, and/or 808 are performed, the procedures in block 806 may then be performed.

At 807, the calibration CDMES current pulse waveforms are confirmed by use of an oscilloscope in order to confirm the accuracy of the calibration shots. However, the use of the oscilloscope may also be omitted during this step in the calibration process.

The following discussion provides additional details on the sequence of the calibration process in one embodiment of the invention:

1. Place the MicroESD antenna 382 of the MiniPulse monitor (ESD detector 355) at closest practical proximity to the process point in the tool where the sensitive IC device will be placed.
2. Connect the MicroESD antenna cable to the powered MiniPulse monitor 355.
3. Set the DC power supply voltage for the CDMES to the required threshold voltage level (typically approximately 50% of the IC device failure threshold).
4. Position the CDMES at the designated process point chosen for the sensitive IC device monitoring application.
5. Trigger the CDMES while adjusting the MiniPulse detection threshold control until the required ESD event detection threshold for the MiniPulse 355 is reached.
6. Generate a minimal statistical group (e.g., 12-24) of CDMES discharges at the IC device specified threshold voltage to verify the MiniPulse detector performance.
7. Record the successful calibration data in the form of the CDMES DC voltage level, the number of successful MiniPulse detections during the statistical sampling group, and the MiniPulse threshold settings via the front panel test points with a digital multi-meter.

It is also understood that other systems according to an embodiment of the invention can have other forms and can have other different components that are arranged in other ways or in other orientations.

Other variations and modifications of the above-described embodiments and methods are possible in light of the teaching discussed herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus for electrostatic discharge (ESD) events monitoring incorporating a charged device model event simulator (CDMES) unit, the apparatus comprising:
    an ESD detector coupled to at least one antenna;
    said ESD detector wirelessly coupled to said CDMES unit; and
    said ESD detector calibrated for different discharge energies generated by said CDMES unit;
    wherein said ESD detector is configured to compare an adjustable threshold voltage level with a signal amplitude of an ESD radiant pulse that is received by said at least one antenna;
    wherein said ESD detector is configured to determine if a pulse duration of said ESD radiant pulse is within upper and lower time interval boundaries of an ESD event when said signal amplitude of said ESD radiant pulse exceeds said adjustable threshold voltage level; and
    wherein said ESD detector is configured to generate a signal indicating an EMI (electro-magnetic interference or emission) that is a valid ESD-type event when said pulse duration of said ESD radiant pulse is within said upper and lower time interval boundaries, wherein said ESD detector comprises:
        a first circuit configured to, in response to the signal amplitude of the ESD radiant pulse exceeding the adjustable threshold voltage level, output a second signal for a time duration corresponding to the upper time interval boundary of the ESD event, the second signal representative of said signal amplitude of said ESD radiant pulse exceeding said adjustable threshold voltage level; and
        a second circuit configured to output a third signal only when the signal amplitude of the ESD radiant pulse returns below the adjustable threshold voltage level while the first circuit is outputting the second signal during the time duration, the third signal representative of the ESD radiant pulse exceeding the adjustable threshold voltage level and the ESD radiant pulse being within said time interval boundaries.

2. The apparatus of claim 1, wherein:
    said at least one antenna comprises a first antenna coupled to said ESD detector and a second antenna coupled to said ESD detector; and
    said first antenna is positioned in a first process area and said second antenna is positioned in a second process area.

3. The apparatus of claim 2, wherein said first process area is separated from said second process area and wherein said first antenna and second antenna form multi-channels.

4. The apparatus of claim 2, wherein said first antenna and second antenna are similar in an antenna response sensitivity.

5. The apparatus of claim 2, where said first antenna and second antenna are different in antenna response sensitivities.

6. The apparatus of claim 2, wherein the first process area comprises a tool process area having a socket configured to receive a semiconductor chip and an external processing area, wherein the external processing area is external to the tool process area and is separated from the tool process area by a distance, and wherein another antenna is positioned in the external processing area and is coupled to said ESD detector.

7. The apparatus of claim 2, wherein the first process area comprises at least one socket configured to receive at least one semiconductor chip.

8. The apparatus of claim 1, wherein the ESD detector comprises a circuit that is configured to detect radiated pulse electromagnetic signals, configured to discriminate between different pulse event types, and configured to register a charged device model (CDM) event when the CDM event is above a calibrated threshold.

9. The apparatus of claim 1, wherein the ESD detector is configured to discriminate between different pulse event types based on an adjustable pulse event threshold.

10. The apparatus of claim 1, wherein the ESD detector comprises a circuit that is configured to use a two-dimensional algorithm by analyzing EMI (electromagnetic interference) events in a time domain and performing threshold discrimination to detect pulse electrostatic discharge of a certain electromagnetic energy.

11. The apparatus of claim 8, wherein the ESD detector is calibrated for a specific device withstand voltage threshold based on one or more simulations of the CDM event.

12. The apparatus of claim 1, wherein said at least one antenna comprises:
    a micro antenna coupled to the ESD detector;
    wherein the micro antenna comprises antenna gain characteristics for optimal detection at specified ranges while excluding undesired signal sources.

13. The apparatus of claim 1, wherein said ESD detector is configured to send said ESD radiant pulse to an alarm output driver in order to permit the alarm output driver to send an output event occurrence signal to a tool or computer or configured to send said ESD radiant pulse to an audio or visual indicator.

14. A method for electrostatic discharge (ESD) events monitoring incorporating a charged device model event simulator (CDMES) unit, the method comprising:
    calibrating an ESD detector for different discharge energies;
    detecting one of the discharge energies via at least one antenna and the ESD detector; and
    comparing an adjustable threshold voltage level with a signal amplitude of an ESD radiant pulse that is received by said a least one antenna;
    determining if a pulse duration of said ESD radiant pulse is within upper and lower time interval boundaries of an ESD event by, in response to the signal amplitude of the ESD radiant pulse exceeding the adjustable threshold voltage level, outputting a second signal for a time duration corresponding to the upper time interval boundary of the ESD event, the second signal representative of said signal amplitude of said ESD radiant pulse exceeding said adjustable threshold voltage level; and generating a third signal indicating an EMI (electro-magnetic interference or emission) that is a valid ESD-type event only when the signal amplitude of the ESD radiant pulse returns below the adjustable threshold voltage level while the second signal is being output during the time duration, the third signal representative of the ESD radiant pulse exceeding the adjustable threshold voltage level and the ESD radiant pulse being within said time interval boundaries.

15. The method of claim 14, wherein said detecting comprises:

discriminating between different pulse event types based on an adjustable pulse event threshold.

16. The method of claim 14, wherein said detecting comprises:

using a two-dimensional algorithm by analyzing EMI (electro-magnetic interference) events in a time domain and performing threshold discrimination to detect pulse electrostatic discharge of certain electromagnetic energy.

17. The method of claim 14, further comprising:

setting antenna gain characteristics for optimal detection at specified ranges while excluding undesired signal sources.

18. The method of claim 14, wherein said CDMES unit is configured for in situ calibration, and wherein said CDMES unit comprises a collapsing capacitor.

19. The method of claim 14, wherein said detecting said discharge energies comprises: detecting radiated pulse electromagnetic signals; and wherein said calibrating comprises: discriminating between different pulse event types, and registering a charged device model (CDM) event when the CDM event is above a calibrated threshold.

* * * * *